United States Patent [19]
Peterson

[11] Patent Number: 6,073,002
[45] Date of Patent: Jun. 6, 2000

[54] MIXER CIRCUIT AND COMMUNICATION DEVICE USING THE SAME

[75] Inventor: Vance H. Peterson, Boca Raton, Fla.

[73] Assignee: Motorola, Schaumburg, Ill.

[21] Appl. No.: 09/072,056

[22] Filed: May 4, 1998

[51] Int. Cl.[7] .................................................. H04B 1/26

[52] U.S. Cl. ........................ 455/326; 455/333; 327/113; 327/116; 333/218

[58] Field of Search ..................................... 455/326, 333, 455/323, 324, 313, 318, 293; 327/113, 116, 231, 354, 355, 356, 359; 330/252, 254, 284; 333/100, 138, 218

[56] References Cited

U.S. PATENT DOCUMENTS

| | | | |
|---|---|---|---|
| 4,704,738 | 11/1987 | Graziadei et al. | 455/333 |
| 5,212,828 | 5/1993 | Hatashita t al. | 455/326 |
| 5,329,189 | 7/1994 | Ushida et al. | 330/254 |
| 5,559,457 | 9/1996 | Uda et al. | 327/113 |
| 5,630,228 | 5/1997 | Mittel | 455/326 |
| 5,805,987 | 9/1998 | Kamase | 455/326 |
| 5,901,349 | 4/1999 | Guegnaud et al. | 455/324 |

OTHER PUBLICATIONS

Motorola Linear And Interface Integrated Circuits, Series E, 1985, pp. i and 2–15, by Motorola, Inc.

Wireless Communications Products Data Book, "TQ9172 Active Frequency Mixer", by TriQuint Semiconductor, Inc.

*Primary Examiner*—Dwayne D. Bost
*Assistant Examiner*—Quochien B. Vuong
*Attorney, Agent, or Firm*—Philip P. Macnak

[57] ABSTRACT

A mixer circuit (230) comprises a double balanced mixer (370) including a first pair of transistors (Q3, Q4) and a second pair of transistors (Q5, Q6) and a differential amplifier (330) including a pair of transistors (Q1, Q2) coupled to a first reference voltage (302). A coupling element (C3) is inserted between a common emitter node (391) of the first pair of transistors (Q3, Q4) of the double balanced mixer (370) and the output node of one of the pair of transistors (Q1) of the RF input stage (330), and a coupling element (C4) is inserted between a common emitter node (392) of the second pair of transistors (Q5, Q6) of the double balanced mixer (370) and the output node of the other pair of transistors (Q2) of the differential amplifier (330).

18 Claims, 5 Drawing Sheets

MIXER CIRCUIT AND COMMUNICATION DEVICE USING THE SAME

FIELD OF THE INVENTION

This invention relates in general to circuits for converting a received radio frequency signal and in particular to a mixer circuit for converting a received radio frequency signal by mixing the received radio frequency signal with a local oscillator signal.

BACKGROUND OF THE INVENTION

Frequency conversion circuits are commonly used in receivers to convert an incoming radio frequency (RF) signal to a lower, intermediate frequency (IF) signal. The IF signal is further processed by circuits following the frequency conversion circuit to develop a suitable signal level for passing to a demodulator. The demodulator recovers the information encoded onto the RF signal. The frequency conversion circuit produces the IF signal by mixing the RF signal with one or more local oscillator (L.O.) signals. Thus, the frequency of the IF signal will be determined by the separation in frequency between the radio frequency signal and the local oscillator signals. In one class of receivers, the separation in frequency between the RF signal and L.O. signal is zero, leading to receivers referred to as "zero-IF" receivers. The zero IF mixing process which is nonlinear, will typically produce desired and undesired interfering signals at the IF frequency.

In such zero IF receivers, known means of performing the mixing are to use mixer circuits which may include one or more double balanced mixers. An electrical schematic of a conventional mixer circuit is shown in FIG. 1. The mixer circuit 10 comprises a double balanced mixer 20, current source 40, and an RF input stage 30.

The double balanced mixer 20 comprises transistors Q1, Q2, Q3, and Q4, and resistors R1 and R2. In addition to supplying current from a voltage supply BIAS, resistors R1 and R2 act as output loads for the mixer across which the desired mixing product is generated. The emitters of transistors Q1 and Q2 are connected commonly by way of a common emitter node 21, and the emitters of transistors Q3 and Q4 are connected commonly by way of another common emitter node 22. The bases of transistors Q1 and Q4 are connected to input terminal 23 of the double balanced mixer 20, while the bases of transistors Q2 and Q3 are connected to another input terminal 24 of the double balanced mixer 20. A local oscillator signal is supplied to the input terminals 23 and 24 of the double balanced mixer 20. The collectors of transistors Q1 and Q3 are connected to a common collector terminal 25, while the collectors of transistors Q2 and Q4 are connected to another common collector terminal 26. The power terminal BIAS is connected to the common collector terminals 25 and 26 by way of resistors R1 and R2, respectively. The IF output terminals of the double balanced mixer are connected to common collector terminals 25 and 26 and provide an IF OUTPUT SIGNAL. The configuration of the double balance mixer 20, described above, is often referred to as a Gilbert cell, Gilbert cell element, or Gilbert cell mixer.

The RF input stage 30 comprises transistors Q5 and Q6. The bases of transistors Q5 and Q6 are connected to a pair of input terminals 31 and 32, respectively, while the collector terminal of transistor Q5 is connected to common emitter node 21 of the double balanced mixer 20, and the collector terminal of transistor Q6 is connected to the common emitter node 22 of the double balanced mixer 20. The RF INPUT SIGNAL is connected to input terminals 31 and 32 of the RF input stage 30. The emitters of transistors Q5 and Q6 are connected commonly to a first terminal of current source 40, while the second terminal of the current source 40 is preferably grounded.

This mixer operates properly as long as the voltage BIAS is high enough to support the stacked (or combined) voltage drops across R1 or R2, the double balanced mixer transistors Q1, Q2, Q3, or Q4, the RF input stage transistors Q5 or Q6, and finally, the current source. For example, a typical mixer might require load resistors R1 and R2 equal to 2000 ohms for purposes of achieving sufficient mixer gain. With a mixer tail current of 200 uA, a voltage drop of 200 mV appears across the load resistors. Each load resistor must carry approximately 100 uA. If the active devices within the double balanced mixer, RF input stage, and current source must each have voltage drops of at least 300 mV, a simple addition shows that the voltage BIAS must be at least 1.1V to support proper bias conditions within the mixer. Some margin will be needed on the 1.1V supply to provide design margin. The bias supply voltage delivered to the local oscillator signal terminals must be 1.3V in order to provide sufficient base currents for the double balanced mixer devices. In communication products such as pagers, mixer circuits must operate with a combination of low current drain and low supply voltage. The low supply voltage approaches 1 volt in current designs. Conventional mixer circuits configured as in FIG. 1 are typically operated with power supply voltages somewhat higher than 1.3 volts in order to provide enough headroom for biasing the mixer circuit properly.

Referring to FIG. 2, an electrical schematic of another conventional mixer circuit 10 is shown. The mixer circuit 10 has generally, similar construction to the mixer circuit described herein above with reference to FIG. 1, except for having the current source 40 deleted.

The double balanced mixer 20 comprises transistors Q1, Q2, Q3, and Q4, and resistors R1 and R2. In addition to supplying current from a voltage supply BIAS, resistors R1 and R2 act as output loads for the mixer across which the desired mixing product is generated. The emitters of transistors Q1 and Q2 are connected commonly by way of a common emitter node 21, and the emitters of transistors Q3 and Q4 are connected commonly by way of another common emitter node 22. The bases of transistors Q1 and Q4 are connected to input terminal 23 of the double balanced mixer, while the bases of transistors Q2 and Q3 are connected to another input terminal 24 of the double balanced mixer. A local oscillator signal is supplied to the input terminals 23 and 24 of the double balanced mixer. The collectors of transistors Q1 and Q3 are connected to a common collector terminal 25, while the collectors of transistors Q2 and Q4 are connected to another common collector terminal 26. A power terminal BIAS is connected to the common collector terminals 25 and 26 by way of resistors R1 and R2, respectively. The IF output terminals of the double balanced mixer 20 are connected to common collector terminals 25 an 26 an provide an IF OUTPUT SIGNAL.

The RF input stage comprises transistors field effect transistors Q5 and Q6. The gates of transistors Q5 and Q6 are connected to a pair of input terminals 31 and 32, respectively. The drain terminal of transistor Q5 is connected to common emitter node 21 of the double balanced mixer 20, and the drain terminal of transistor Q6 is connected to the common emitter node 22 of the double balanced mixer 20. The RF INPUT SIGNAL is connected to input terminals 31 and 32 of the RF input stage 30. The sources of transistors Q5 and Q6 are preferably connected commonly to ground.

This mixer circuit 10 will operate with a 1 volt supply since the mixer current source has been removed. A penalty results from eliminating the current source since mixer bias stability depends upon a stable current reference supply. The mixer circuit 10 shown in FIG. 2 also introduces another problem common to zero IF mixers which involves the generation of direct current (DC) offsets within the mixer. A drawback of removing the mixer's current source is that mixer DC offsets become enhanced, whereas minimal DC offset is desired. DC offset manifests itself as a dynamically changing differential voltage appearing across the mixer's IF PORT. High level RF signals which reach the double balanced mixer will cause DC offsets to occur as the mixer circuit becomes overdriven. The mixer does not contain a self-limiting feature which prevents high level RF signals from over-driving the double balanced mixer, and thus controlling mixer DC offset levels under large RF signal conditions.

The conventional double balanced mixer circuit in FIG. 2 uses field-effect transistors in the mixer's RF input stage 30. While it has been found that field-effect transistors improve the intermodulation behavior of the mixer circuit, which must be sufficiently good to meet the stringent requirements imposed on the circuit when used in, for example, paging receivers. Intermodulation results from non-linearity of the RF input stage 30. Second-order non-linearity in the mixer impairs zero-IF receiver performance. The field-effect transistors, being square law devices, will detect the envelope of undesired amplitude modulation (AM) signals within the pass band of the receiver. A fully balanced circuit helps to relieve this problem to some extent. However, the field-effect transistors will produce common-mode detection of the envelope of any unwanted AM signals and subsequently pass these unwanted common mode currents into the double balanced mixer. Since the double balanced mixer shares the current through the field effect transistors, the envelope of the unwanted AM signals will appear as spurious signals at the IF output and interfere with desired mixing products. The amplitudes of the spurious energy for a given amplitude of the unwanted AM signal at the mixer input is characterized by a second-order intercept for the mixer. It is desirable for a zero-IF mixer to have a high second-order intercept to reduce the impairment of zero-IF receivers by high level AM signals in the receiver pass band. Since the zero-IF receiver does not typically offer a high degree of selectivity before the mixer stage, interfering AM signals will enter the mixer from far outside the receiver pass band.

Thus, a mixer circuit is required which has reduced DC offsets generated by large RF input signals and increased rejection of AM carriers, combined with the characteristics of operating within the 1 volt power supply limitation. Additional advantages of the present invention will be discussed in the description of the invention which follows.

DESCRIPTION OF THE PREFERRED EMBODIMENTS

Figure 1:
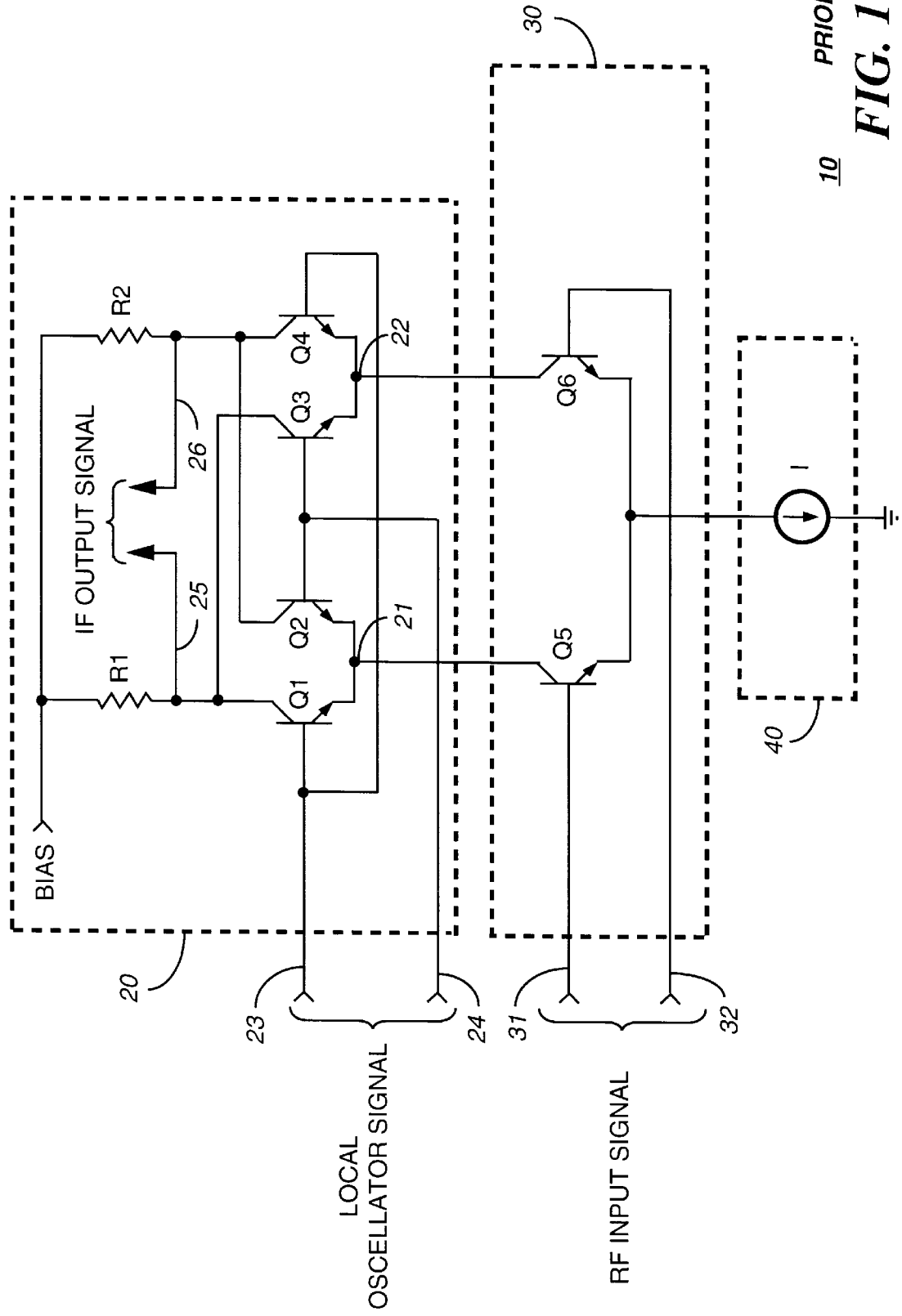
FIG. 1 is an electrical schematic diagram of a conventional double balanced mixer circuit.
Figure 2:
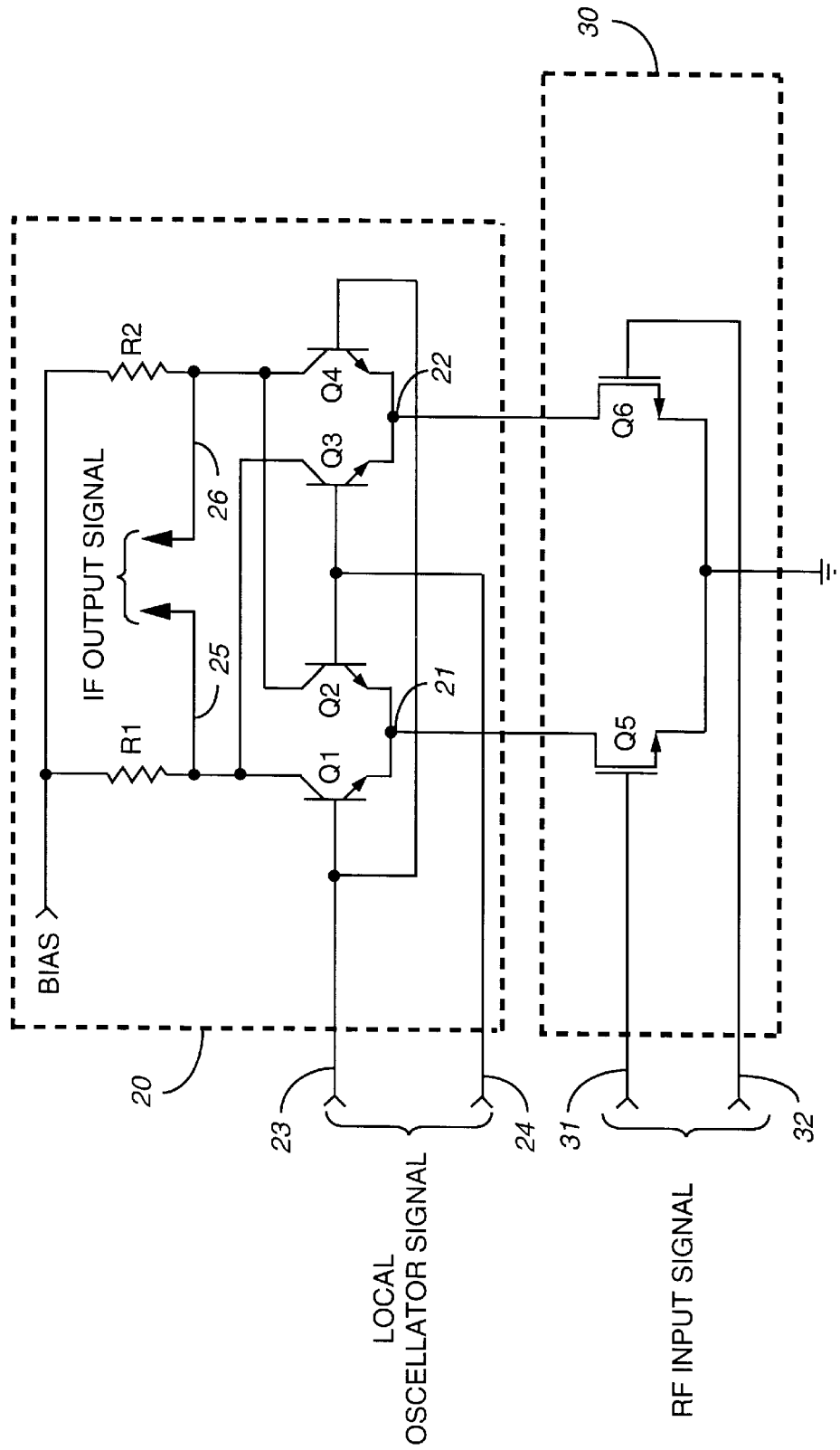
FIG. 2 is an electrical schematic diagram of another conventional double balanced mixer circuit.
Figure 3:
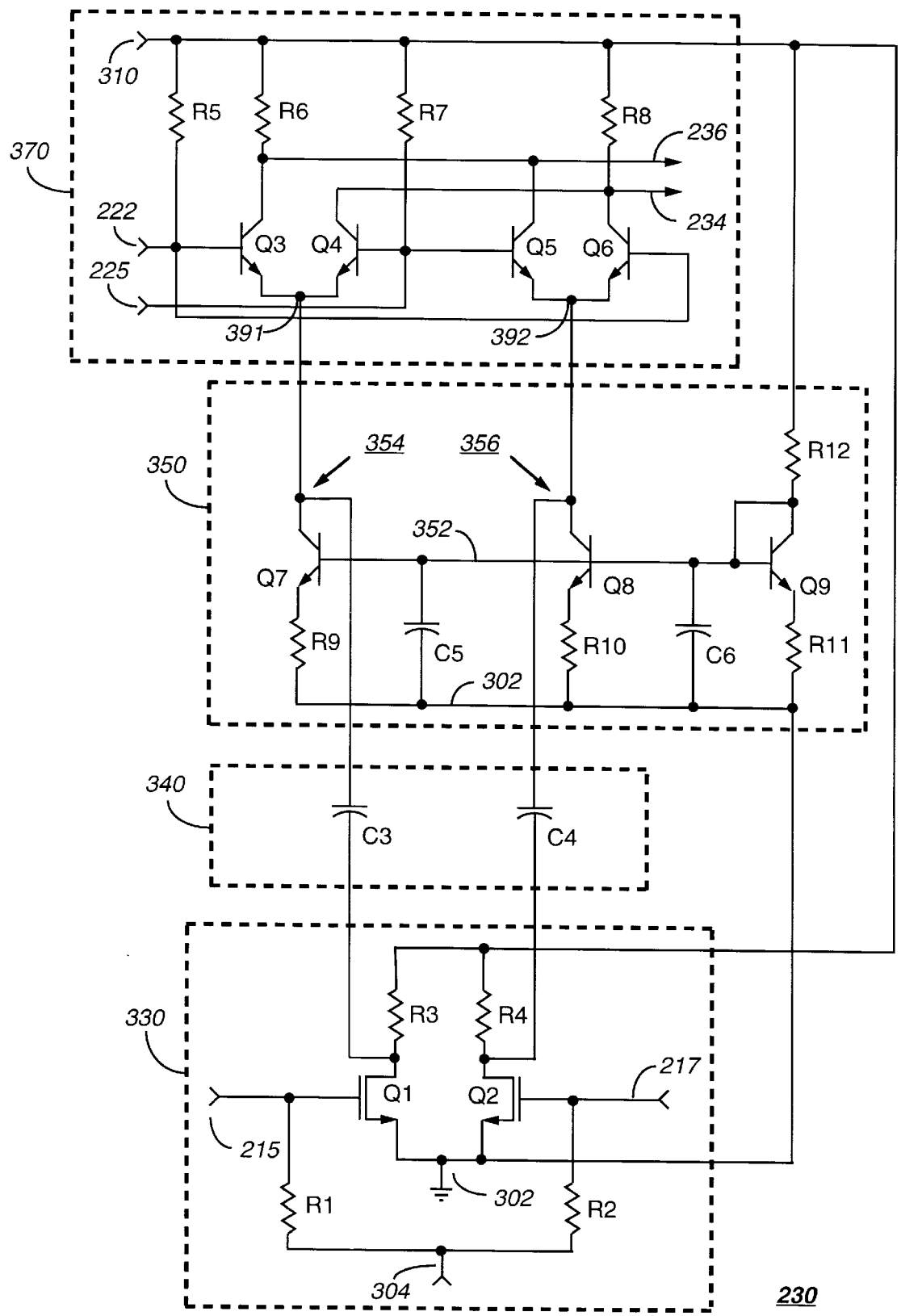
FIG. 3 is an electrical schematic diagram of a mixer circuit in accordance with the preferred embodiment of the present invention.

Referring to FIG. 3, a mixer circuit 230 is shown in accordance with the preferred embodiment of the present invention. The mixer circuit 230 comprises a double balanced mixer 370, which is often referred to by one of ordinary skill in the art as a Gilbert cell, a current source 350, coupling circuit 340, and RF input stage 330. The double balanced mixer 370 comprises four transistors forming a first differentially coupled transistor pair Q3, Q4, and a second differentially coupled transistor pair Q5, Q6; and four bias resistors R5, R6, R7, and R8. The transistors Q3, Q4, Q5, and Q6 are preferably bipolar NPN transistors, each having a base terminal, a collector terminal, and an emitter terminal. The emitters of transistors Q3 and Q4 are connected commonly by way of a common emitter node 391, and the emitters of transistors Q5 and Q6 are connected commonly by way of another common emitter node 392. The bases of transistors Q3 and Q6 are connected to an input 222 of the double balanced mixer 370, while the bases of transistors Q4 and Q5 are connected to an input 225 of the double balanced mixer 370, providing cross-coupled based nodes which form a pair of inputs, input 222 and input 225. A local oscillator signal is coupled differentially to input 222 and input 225 of the double balanced mixer 370. The collectors of transistors Q3 and Q5 are connected to a common collector terminal 236, while the collectors of transistors Q4 and Q6 are connected to another common collector terminal 234, providing cross-coupled collectors nodes which form a pair of outputs. A power terminal 310 is connected to the common collector terminal 234 and common collector terminal 236 by way of resistors R8 and R6, respectively, and power terminal 310 is connected to the pair of inputs, input 222 and input 225 by way of resistors R5 and R7, respectively.

Current supplied by a power supply, coupled to power terminal 310, is coupled in series through the double balanced mixer 370 by way of current source 350, as will be described more fully below.

The current source 350 comprises three transistors Q7, Q8, and Q9, four resistors R9, R10, R11, and R12, and noise decoupling capacitors C5 and C6. The transistors Q7, Q8, and Q9 are preferably bipolar NPN transistors, each having a base terminal, a collector terminal, and an emitter terminal. The bases of the transistors Q7, Q8, and Q9 are connected commonly by way of a common base node 352 and the collector terminal of transistor Q9 is connected to the common base node 352. The second terminals of the resistors R9, R10, and R11 and the second terminals of the capacitors C5 and C6 are connected together and to a first reference voltage 302, which is preferably a ground reference. The first terminals of the capacitors C5, and C6 are direct current coupled together and to common base node 352, while the first terminals of the resistors R9, R10, and R11 connect, respectively, to the emitter terminals of the transistors Q7, Q8, and Q9. The collector terminals of the transistors Q7 and Q8 are connected to common emitter node 391 and common emitter node 392, respectively. The power terminal 310 is connected to the collector terminal of Q9 by way of the resistor R12. Transistor Q7 and resistor R9 form a bias element 354 which is coupled to the common emitter node 391 of the first differentially coupled transistor pair, Q3 and Q4; and transistor Q8 and resistor R10 form a bias element 356 which is coupled to the common emitter node 392 of the second differentially coupled transistor pair, Q5 and Q6.

The RF input stage 330 comprises a differential amplifier which includes two transistors Q1 and Q2, and two resistors R3 and R4. The transistors, Q1 and Q2, are preferably field effect transistors, each having a gate terminal, a drain terminal, and a source terminal. The source terminals of the transistors, Q1 and Q2, are connected together and to the first reference voltage 302, which is a ground reference. The power terminal 310 is connected to the drain terminal of transistors Q1 and Q2 by way of the bias resistors R3 and R4, respectively. The gate terminal of the transistor Q1 forms a plus terminal defined as input 215. The gate terminal of the transistor Q2 forms a minus terminal defined as input 217. The input 215 and input 217 are further connected, respectively, to the first terminals of resistors R1 and R2, which are bias resistors. The second terminals of the bias resistors R1 and R2 are connected to a second reference voltage 304.

A coupling circuit 340, comprising coupling elements, preferably capacitors, C3 and C4, which are interposed between the RF input stage 330 and the double balanced mixer 370, and with this configuration, the second order distortion characteristic of each of the transistors of the RF input stage 330 incurs high attenuation, as capacitors C3 and C4 form high pass filter sections which attenuate the low frequency second-order distortion components generated by the transistors Q1 and Q2 in the RF input stage 330.

In the preferred embodiment of the present invention, the first reference voltage 302 is ground, the second reference voltage is 0.790 volts, and the power supply reference voltage is 1.00 volt DC. In the double balanced mixer 370, the bias resistors R5 and R7 have a value of 10K ohms, the resistors R6 and R8 have a value of 1600 ohms, and the transistors Q3, Q4, Q5, and Q6 are designed to provide optimum gain and noise figure at the highest operating frequency, which by way of example is 320 MHz for the mixer circuit 230. In the current source 350, the bias resistors R9 and R10 have a value of 575 ohms, the bias resistor R11 and R12 have a value of 1150 ohms, and the transistors Q7, Q8 and Q9 are chosen to provide 120 uA of DC current in each of the bias resistors R6 and R8. The RF input stage has resistors R3 and R4, each set to a value of 4K ohms, bias resistors R1 and R2 have a value of 10K ohms, and the transistors Q1 and Q2 are designed to provide optimum gain and noise figure at the highest operating frequency, which by way of example is 320 MHz. In the coupling circuit 340, capacitors C3 and C4 each has a value of 5 picofarad so as to offer high attenuation to second order distortion components originating in the transistors Q1 and Q2 of the RF input stage 330.

It will be appreciated that in situations when lower dynamic range is acceptable, the transistors Q1 and Q2 may alternatively be bipolar transistors. Similarly, transistors Q3–Q9 may alternatively be field effect transistors (FETs) when lower gain is acceptable. The FETs are substituted for the bipolar NPN transistors in a manner well known in the art with appropriate modification of the values of the resistors R5–R12.

Figure 4:
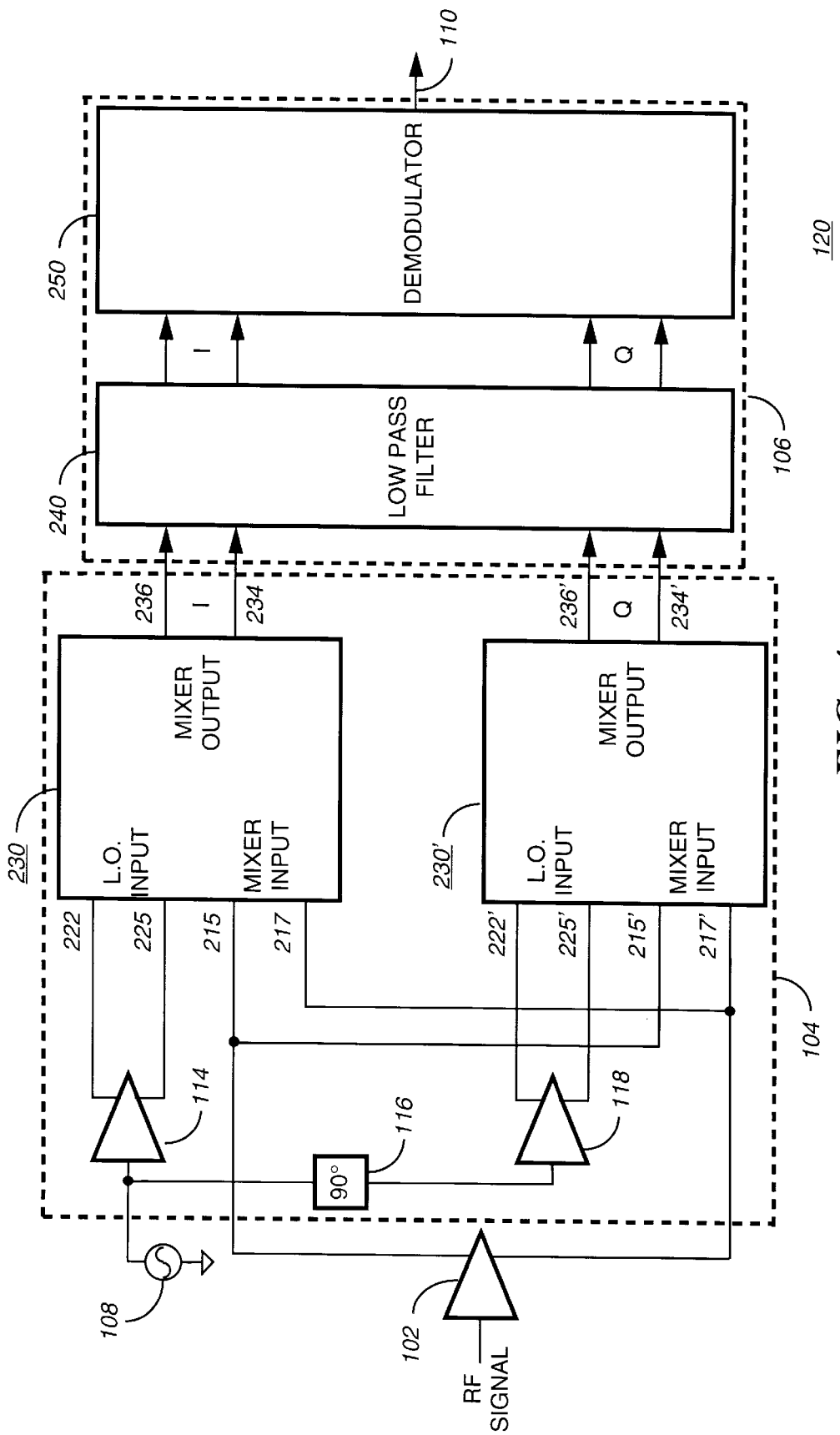
FIG. 4 is an electrical block diagram of a zero-IF receiver in accordance with the present invention.

When a radio frequency source, such as a radio frequency (RF) amplifier 102, shown in FIG. 4, provides a radio frequency signal which is coupled differentially to the input 215 and input 217 of the RF input stage 330; and a local oscillator, such as the local oscillator 108, shown in FIG. 4, provides a local oscillator signal which is coupled differentially to the input 222 and the input 225 of the double balanced mixer 370, the mixer circuit produces at the output an intermediate frequency signal which can be further processed in a manner well known in the art in a non-coherent frequency modulation system, or as will be further described in FIG. 4 for a coherent frequency modulation system.

In summary, a mixer circuit has been described above which comprises a double balanced mixer having first and second pairs of transistors, and a differential amplifier having a pair of transistors grounded at one node. A first coupling element is inserted between a common emitter node of the first pair of transistors of the double balanced mixer, and the output node of one of the pair of transistors of the differential amplifier; and a second coupling element is inserted between a common emitter node of the second pair of transistors of the double balanced mixer and the output node of the other pair of transistors of the differential amplifier. Within the mixer circuit, the second order distortion characteristic of each of the transistors of the differential amplifier incurs high attenuation as it passes through the first and second coupling elements provided between the differential amplifier and the double balanced mixer. Consequently, the second order distortion characteristic of the mixer circuit is improved. Further, by the use of AC coupling between the differential amplifier and the double balanced mixer, the overall mixer circuit is configured to operate within the low voltage power supply headroom commonly found in communication receivers, such as pagers. The bias stability of the mixer circuit is not degraded by strong RF input signals which can change the bias of the differential amplifier, since the coupling circuit prevents such bias disturbance from entering the double balanced mixer. Furthermore, the differential amplifier is provided with a self-limiting characteristic which limits the amount of strong RF signal reaching the double balanced mixer. By limiting the level of strong RF signals entering the double balanced mixer, DC offset at the mixer output is reduced, and thereby provides improvement of a critical zero-IF mixer characteristic.

Referring to FIG. 4, an electrical block diagram of a receiver section 120 which can be used in communication device 100, such as a selective call receiver to be described in detail below, is shown in accordance with the present invention. The radio signal is coupled to an RF amplifier 102 which is of conventional design and provides a differential RF signal output. The RF amplifier 102 amplifies the radio signal and provides an amplified, differential RF signal. The amplified, differential RF signal is coupled differentially to input 215 and input 217 of a mixer circuit 230, and to input 215' and input 217' of a mixer circuit 230', both of which are of unique design, as described above. An oscillator circuit, such as a local oscillator (L.O.) 108 is coupled to the input of a first differential amplifier 114, which amplifies the local oscillator signal and produces an in-phase differential L.O. signal (I) having plus and minus components at mixer circuit 230 input 222 and input 225, and to the input of a 90° phase shift network 116 (ninety degree phase shift network). The output of the 90° phase shift network is a quadrature-phase local oscillator signal which is coupled to the input of a second differential amplifier 118 which amplifies the 90° phase-shifted local oscillator signal and produces a quadrature-phase differential L.O. signal (Q) also having plus and minus components at mixer circuit 230' input 215' and input 217'. The I and Q signals are at the same frequency, but as described above, the Q channel signal is 90° out of phase with the I channel signal. The mixer circuit 230 provides an I channel baseband differential output signal at common collector terminal 236 and common collector terminal 234, and the mixer circuit 230' provides a Q channel baseband differential output signal at common collector terminal 236' and common collector terminal 234'. The I channel and Q channel baseband differential output signals include components at higher frequencies than the desired components. As configured, the mixer circuit 230 and the mixer circuit 230', which correspond to a first Gilbert cell mixer element and a second Gilbert cell mixer element in a zero-IF mixer 104, couples to a processing circuit 106 which includes a low pass filter 240, and a demodulator 250. The I channel and Q baseband differential output signals are coupled to the low pass filter 240, which is of conventional design. The low pass filter 240 filters the higher frequency components from the baseband differential output signals, and passes filtered baseband differential output signals to the demodulator 250, which is of conventional design. The demodulator 250 provides the demodulated radio signal 110 from the filtered I channel and Q channel baseband differential output signals in a manner well known to one of ordinary skill in the art.

Figure 5:
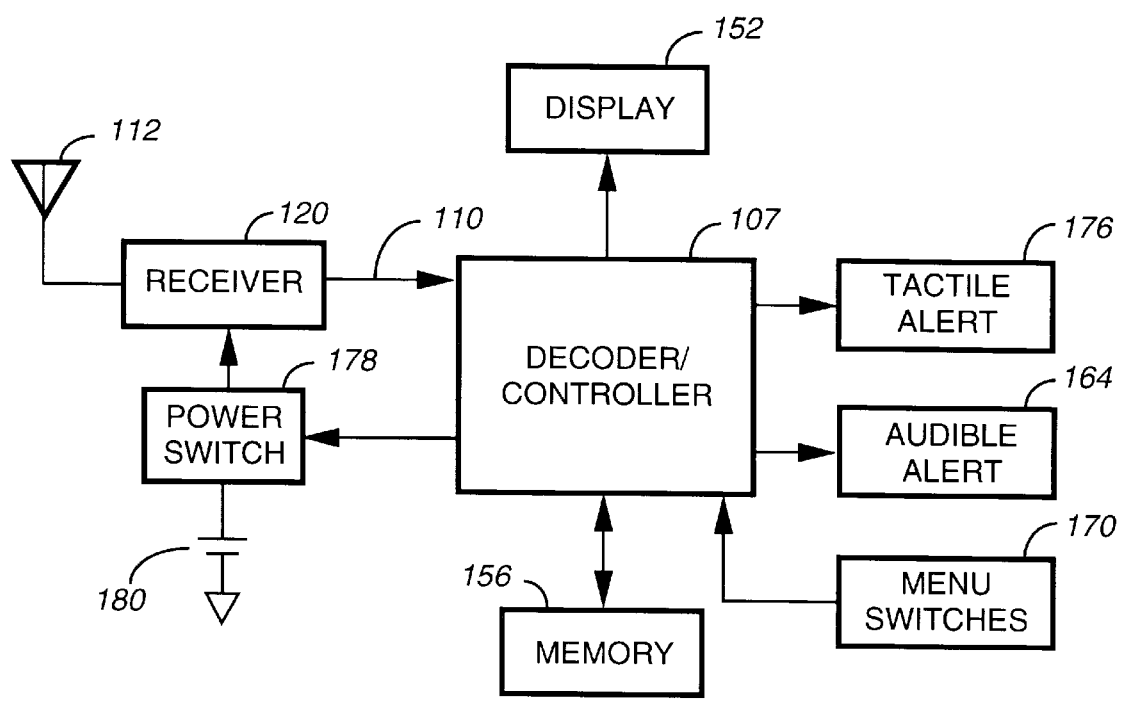
FIG. 5 is an electrical block diagram of a communication device, in accordance with the present invention.

Referring to FIG. 5, an electrical block diagram is shown of a communication device 100, such as selective call receiver, in accordance with the present invention. When configured as a selective call receiver, the communication device 100 operates to intercept a radio frequency signal, via a conventional antenna 112 which is coupled to the receiver section 120 described above. The receiver section 120 operates to filter, convert, and demodulate the received radio signal and couples a demodulated radio signal 110 to a decoder/controller 107 which comprises conventional control logic for decoding a selective call address and for recovering a selective call message contained within the radio signal, in a manner well known in the art. The radio frequency signal may include an address, a telephone number, alphanumeric data, or other types of selective call messages. A conventional address memory 156 stores a predetermined address, and is coupled to the decoder/controller 107. The decoder/controller 107 is further coupled to a battery 180 through a power switch 178 which, under the control of the decoder/controller 107, selectively controls the supply of power to the receiver section 120 to provide battery saving. The decoder/controller 107 is further coupled to a display 152, menu switches 170, and alert devices which include audible alert device 164 and tactile alert device 176. User input to the selective call receiver is by way of the menu switches 170, and a variety of user programmable features is accessed via the menu switches 170, through the use of information displayed on the display 152. The user may select the type of alert desired via the menu switches 170 and thereby selectively enable the audible alert device 164 and the tactile alert device 176. The display 152, menu switches 170, audible alert device 164 and tactile alert device 176 are of conventional design.

The communication device 100 is representative of many other receiving devices such as cellular telephones, television receivers, and broadcast communication receivers. Other receiving devices which include dual conversion, optical, and modems can also benefit from the present invention.

I claim:

1. A mixer circuit, comprising:
   a double balanced mixer including a first differentially coupled transistor pair and a second differentially coupled transistor pair, each of said first differentially coupled transistor pair and said second differentially coupled transistor pair having a common emitter node connected to a bias element, cross-coupled collector nodes which form a pair of outputs, and cross-coupled base nodes which form a pair of inputs; and
   a differential amplifier having a pair of inputs and a first and second output, said first output being coupled through a coupling element to said common emitter node of said first differentially coupled transistor pair, and said second output being coupled through the coupling element to said common emitter node of said second differentially coupled transistor pair.

2. The mixer circuit of claim 1, wherein the bias element is a current source.

3. The mixer circuit of claim 1, wherein said differential amplifier utilizes field effect transistors.

4. The mixer circuit of claim 1, wherein said differential amplifier utilizes bipolar transistors.

5. The mixer circuit of claim 1, wherein said coupling element is a pair of capacitors.

6. The mixer circuit of claim 5, wherein said capacitors form high pass filter sections.

7. The mixer circuit of claim 1, wherein a radio frequency source couples to said pair of inputs of said differential amplifier, a local oscillator couples to said pair of inputs of said double balanced mixer, and an intermediate frequency signal is generated at said pair of outputs of said double balanced mixer.

8. A mixer circuit comprising:
   a double balanced mixer comprising a first pair of bipolar transistors and a second pair of bipolar transistors, each of said first pair of bipolar transistors and said second pair of transistors having a common emitter node connected to a bias element; and
   a differential amplifier, comprising first and second field effect transistors which provide a pair of outputs, each of said pair of outputs is coupled through a capacitor to said common emitter node of each of said first pair of bipolar transistors and said second pair of bipolar transistors.

9. The mixer circuit of claim 8, wherein the bias element is a current source.

10. The mixer circuit of claim 8, wherein said capacitor forms a high pass filter section.

11. A zero-IF mixer, comprising:
    a first mixer circuit, comprising
       a first Gilbert cell having a first pair of inputs and a second pair of inputs, said first pair of inputs being coupled to an in-phase differential local oscillator signal, and
       a first differential amplifier, comprising first and second field effect transistors which provide a first pair of inputs which couple to a radio frequency signal, and a first pair of outputs which couple through a first coupling element to said second pair of inputs of said first Gilbert cell; and
    a second mixer circuit comprising
       a second Gilbert cell having a first pair of inputs and a second pair of inputs, said first pair of inputs being coupled to a quadrature-phase differential local oscillator signal being derived from the in-phase differential local oscillator signal, and
       a second differential amplifier, comprising first and second field effect transistors which provide a second pair of inputs which couple to the radio frequency signal, and a second pair of outputs which couple through a second coupling element to said second pair of inputs of said second Gilbert cell.

12. The zero-IF mixer of claim 11, further comprising:
    a local oscillator for generating a local oscillator signal; and a first amplifier, coupled to said local oscillator, and providing a differential output, wherein the local oscillator signal is converted by said first amplifier into the in-phase differential local oscillator signal.

13. The zero-IF mixer of claim 12 further comprising a ninety degree phase shift network having a input coupled to said local oscillator, and an output, said ninety degree phase shift network converting the local oscillator signal into a quadrature-phase local oscillator signal.

14. The zero-IF mixer of claim 13, further comprising:

a second amplifier, coupled to said output of said ninety degree phase shift network, and providing a differential output, wherein the quadrature-phase local oscillator signal is converted by said second amplifier into the quadrature-phase differential local oscillator signal.

15. A communication device comprising:

an antenna for intercepting a radio frequency signal carrying information;

a radio frequency amplifier, coupled to said antenna, for amplifying the radio frequency signal which is intercepted;

an oscillator circuit for generating an in-phase differential local oscillator signal, and a quadrature-phase differential local oscillator signal;

a mixer circuit comprising a first mixer circuit comprising a first Gilbert cell mixer element having first inputs coupled to the in-phase differential local oscillator signal, and second inputs coupled to a first coupling element to a first differential amplifier comprising first and second field effect transistors, for generating therefrom an in-phase output signal, and a second mixer circuit comprising a second Gilbert cell mixer element having first inputs coupled to the quadrature-phase differential local oscillator signal, and second inputs coupled to a second coupling element to a second differential amplifier comprising first and second field effect transistors, for generating therefrom a quadrature-phase output signal; and a demodulator for demodulating the in-phase output signal, and the quadrature-phase output signal to produce the information.

16. The communication device according to claim 15, wherein said first differential amplifier and said second differential amplifier further amplify the radio frequency signal.

17. The mixer circuit of claim 15, wherein said coupling element is a pair of capacitors.

18. The mixer circuit of claim 17, wherein said capacitors form high pass filter sections.

* * * * *